United States Patent [19]
Lin et al.

[11] Patent Number: 5,546,026
[45] Date of Patent: Aug. 13, 1996

[54] LOW-VOLTAGE HIGH-PERFORMANCE DUAL-FEEDBACK DYNAMIC SENSE AMPLIFIER

[75] Inventors: Jyhfong Lin, Fremont, Calif.; Bruce Doyle, Richardson, Tex.

[73] Assignee: Cirrus Logic, Inc., Fremont, Calif.

[21] Appl. No.: 432,959

[22] Filed: May 1, 1995

Related U.S. Application Data

[63] Continuation-in-part of Ser. No. 396,591, Mar. 1, 1995, Pat. No. 5,506,524.

[51] Int. Cl.⁶ .................................................. G01R 19/00
[52] U.S. Cl. .................... 327/54; 327/52; 327/57
[58] Field of Search ................. 327/51–57; 365/185, 365/184, 189.01, 203, 205, 210

[56] References Cited

U.S. PATENT DOCUMENTS

| | | | |
|---|---|---|---|
| 4,124,808 | 11/1978 | Shieu et al. | 327/55 |
| 4,511,810 | 4/1985 | Yukawa | 327/52 |
| 4,697,112 | 9/1987 | Ohtani et al. | 327/55 |
| 4,871,933 | 10/1989 | Galbraith | 327/53 |
| 5,162,681 | 11/1992 | Lee | 327/53 |
| 5,231,318 | 7/1993 | Reddy | 327/52 |

Primary Examiner—Timothy P. Callahan
Assistant Examiner—Kenneth B. Wells
Attorney, Agent, or Firm—Frank D. Nguyen

[57] ABSTRACT

A sense amplifier circuit includes a voltage developing stage which receives first and second data inputs, din1 and din2, and generates a differential voltage, in response to feedback signals received from a first and second data outputs, dout1 and dour2, of the sense amplifier circuit, which is indicative of a voltage difference between the first and second data inputs, din1 and din2; a full-swing locking stage which generates and latches, in response to a control signal $\Phi_2'$, complementary latched data outputs from the first and second data outputs, dout1 and dout2, generated by the voltage developing stage; and a voltage equalization stage which equalizes, in response to a control signal $\Phi_0'$, voltages on data lines respectively connected to the first and second data outputs, dout1 and dout2. In addition, the voltage equalization stage is used to initiate the voltage developing stage. Timing of the control signals, $\Phi_0'$ and $\Phi_2'$, is such that the control signal $\Phi_2'$ is activated after a finite period following the deactivation of the second control signal $\Phi_0'$. To minimize power consumption of the sense amplifier circuit, the control signal $\Phi_0'$ is deactivated when either the voltage developing or full-swing locking stage is in operation and the voltage equalization stage is not needed.

19 Claims, 9 Drawing Sheets

LOW-VOLTAGE HIGH-PERFORMANCE DUAL-FEEDBACK DYNAMIC SENSE AMPLIFIER

RELATED APPLICATIONS

This application is a Continuation-in-part of U.S. patent application Ser. No. 08/396,591, filed Mar. 1, 1995, now U.S. Pat. No. 5,506,524 for "LOW-VOLTAGE LOW-POWER DYNAMIC FOLDED SENSE AMPLIFIER".

BACKGROUND OF THE INVENTION

This invention relates in general to sense amplifier circuits and in particular, to a high-speed sense amplifier circuit operable with low-voltage power sources to provide, on two output data lines, a first and a second complementary latched logic level data output indicative of a voltage difference between two input data lines.

FIGS. 1A and 1B respectively illustrate, as examples, a conventional latched sense amplifier circuit 2, and a block diagram of a sensing circuit 1 which includes the latched sense amplifier circuit 2. The sense amplifier circuit 2 generates complementary data outputs, dout1' and dout2', which are indicative of a differential voltage between two data inputs, din1 and din2, received by the sense amplifier circuit 2. The output voltages, dout1' and dout2', generated by the sense amplifier circuit 2 generally do not reach full-swing (i.e., the HIGH output does not reach Vdd, and the LOW output does not reach GND), because the differential voltage received by the sense amplifier circuit 2 is typically too small. Accordingly, the sensing circuit 1 also includes a latching circuit 3 which generates latched logic level outputs, dout1 and dout2, by pulling the data outputs, dout1' and dout2', up to their respective full-swing or logic level values, and holding them there.

One problem with the sensing circuit 1 of FIG. 1b, is that the latching circuit 3 introduces a delay which reduces the overall performance of the sensing circuit 1. Another problem is that dc power dissipation frequently is unavoidable in such designs. Still another problem is that such designs frequently perform poorly when operated with low voltage sources such as batteries.

OBJECTS AND SUMMARY OF THE INVENTION

Accordingly, one object of the present invention is to provide high performance sense amplifier circuit providing latched logic level outputs.

Another object is to provide a low-power sense amplifier circuit which consumes minimal power while providing latched logic level outputs.

Another object is to provide a low-voltage sense amplifier circuit which operates with low voltage supply sources, such as a battery, for providing latched logic level outputs.

Still another object is to provide a low cost, easily manufacturable sense amplifier circuit which operates with low voltage supply sources, consumes minimal power, and provides latched logic level outputs.

These and additional objects are accomplished by the various aspects of the present invention, wherein briefly stated, one aspect of the present invention is a high performance low-voltage dual-feedback dynamic sense amplifier circuit which provides a latched complementary logic level data output indicative of a voltage difference between first and second data inputs. The sense amplifier circuit is referred to as being "low-voltage" because it is operable with low voltage power sources, such as a 1.5 volt battery, as well as standard logic level voltage sources, such as a 5.0 volt power supply; it is referred to as being "high-performance" because of its quick response time in generating a latched complementary logic level data output; it is referred to as being "dual-feedback" because of its utilization of positive feedback in two different stages to generate the latched complementary logic level data output; and it is referred to as being "dynamic" because of its use of timed control signals to activate or deactivate portions of its circuitry when they are in use and when they are not in use.

Included in the low-voltage, low-power dynamic folded sense amplifier circuit are: a first transistor having a source, a drain, and a gate connected to a first data input; a second transistor having a source, a drain, and a gate connected to a second data input; output generating means connected to the sources of the first and second transistors for generating a first and a second data output indicative of the first and second data input; first switching means, responsive to the first data output of the output generating means, for providing a first reference voltage to the drain of the first transistor; second switching means, responsive to the second data output of the output generating means, for providing the first reference voltage to the drain of the second transistor; third switching means for providing, in response to a first control signal while the first and second switching means are activated, the first reference voltage to the output generating means such that the first data output of the output generating means is latched to a first voltage level determined by the first reference voltage and the second data output of the output generating means is latched to a second voltage level complementary to the first voltage level thereby generating the first and second complementary latched data outputs indicative of the voltage difference between the first and second data inputs; and equalizing means connected to said first and said second data output of said output generating means for equalizing voltages respectively on said first and second data outputs in response to a second control signal being activated.

Another aspect of the present invention is a method of generating a latched logic level data output indicative of a voltage difference between a first data line and a second data line, comprising: forming a latching circuit comprising first and second inverters each having a data input and a data output, wherein the data output of the first inverter is connected to the data input of the second inverter and the data output of the second inverter is connected to the data input of the first inverter; equalizing, in response to a first control signal being active, voltages respectively on the outputs of the first and second inverters; connecting, in response to a first and second activating signals supplied respectively from the data output of a first inverter and the data output of a second inverter, a first voltage corresponding to the first data line connected to the input of the first inverter and a second voltage corresponding to the second data line connected to the input of the second inverter; connecting, in response to a second control signal being active, a reference voltage corresponding to a logic state to the first and second inverters such that the output of the first inverter is pulled to the reference voltage when the data output of the first inverter is to be in the logic state and the data output of said second inverter is pulled to a voltage complementary to the reference voltage when the data output of the second inverter is to be in the logic state, wherein the first and second logic states of the outputs of the first and second inverters are determined by the relative magnitudes of the first and second voltages respectively connected to the inputs of the first and second inverters; and generating the complementary latched data outputs at the outputs of the first and second inverters.

Still another aspect of the present invention is a computer system including a microprocessor; a data bus connected to the microprocessor; and a sense amplifier circuit connected to the data bus, wherein the sense amplifier circuit generates a first and second complementary latched data outputs indicative of a voltage difference between a first and a second data line, the sense amplifier circuit includes a first transistor having a source, a drain, and a gate connected to the first data input; a second transistor having a source, a drain, and a gate connected to the second data input; output generating means connected to the sources of said first and said second transistor for generating a first and a second data output indicative of the first and second data input; first switching means, responsive to the first data output of the output generating means, for providing a first reference voltage to the drain of the first transistor; second switching means, responsive to the second data output of the output generating means, for providing the first reference voltage to the drain of the second transistor; third switching means for providing, in response to a first control signal while the first and second switching means are activated, the first reference voltage to the output generating means such that the first data output of the output generating means is latched to a first voltage level determined by the first reference voltage and the second data output of the output generating means is latched to a second voltage level complementary to said first voltage level thereby generating the first and second complementary latched data outputs indicative of the voltage difference between the first and second data inputs; and equalizing means connected to the first and second data outputs of the output generating means for equalizing voltages respectively on the first and second data outputs in response to a second control signal being activated.

Additional objects, features and advantages of the various aspects of the present invention will be apparent from the following description of its preferred embodiments, which description should be taken in conjunction with the accompanying drawings.

DETAILED DESCRIPTION OF THE PREFERRED EMBODIMENT

Sense amplifier circuits are useful in a number of circuit applications. For example, they are particularly useful in memory reading circuitry for reading the programmed states of memory cells by sensing voltage differences between bit line pairs connected to individual memory cells. As another example, they are useful in comparator circuitry for comparing a voltage on a data line to another voltage by sensing the voltage difference between two voltages.

Figure 1A:
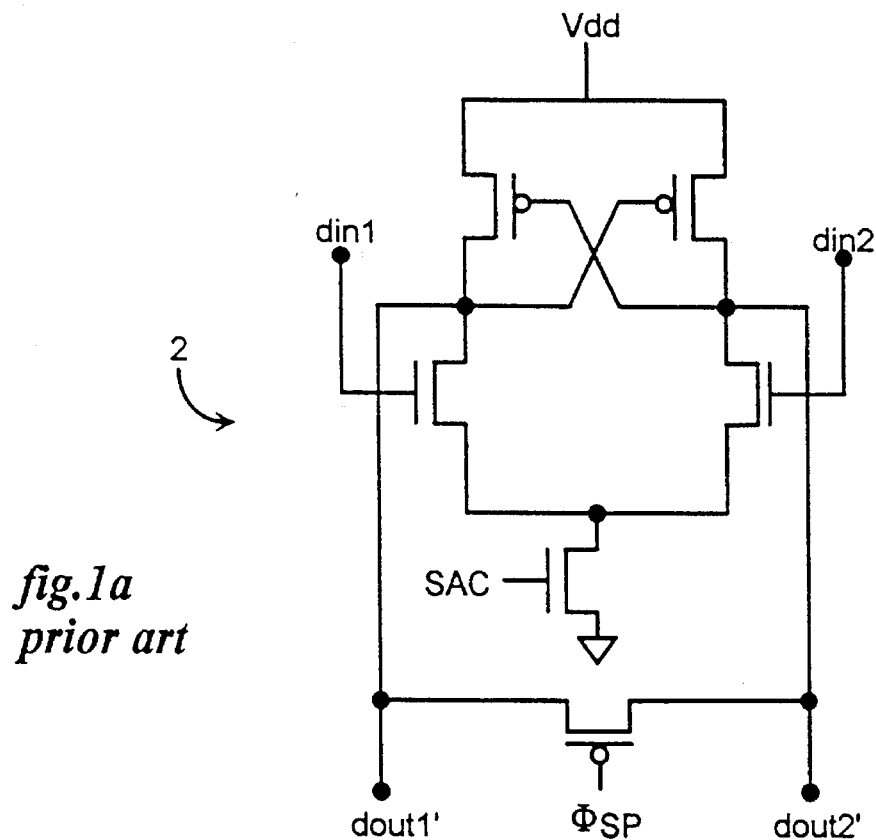
FIGS. 1a and 1b respectively illustrate, as examples, a conventional sense amplifier circuit, and a block diagram of a system including the conventional sense amplifier circuit.
Figure 1B:
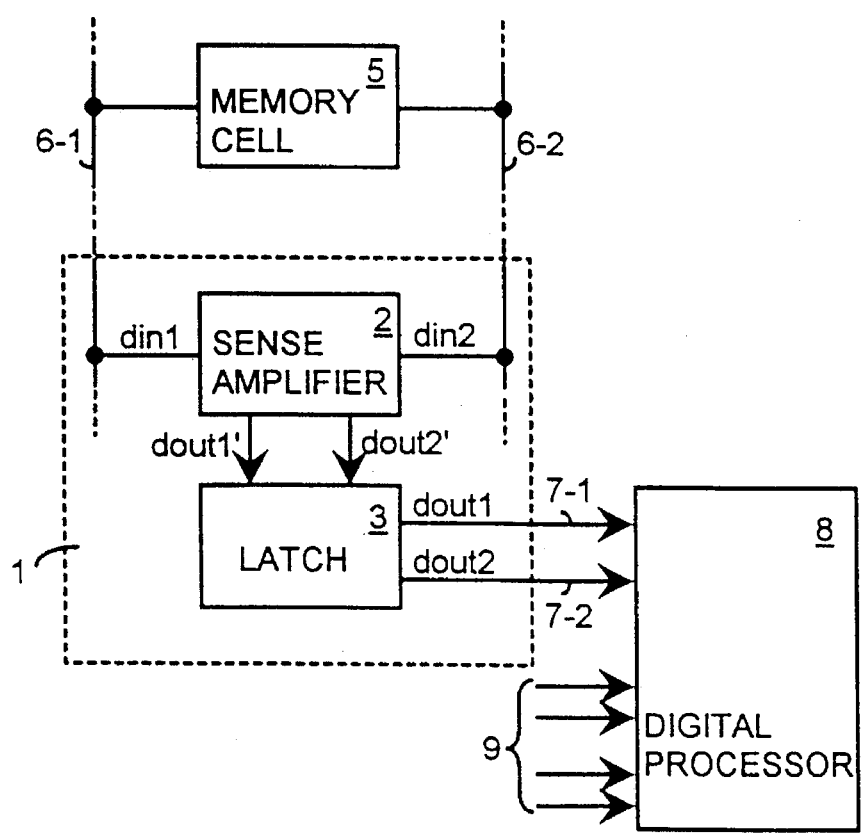
Figure 2:
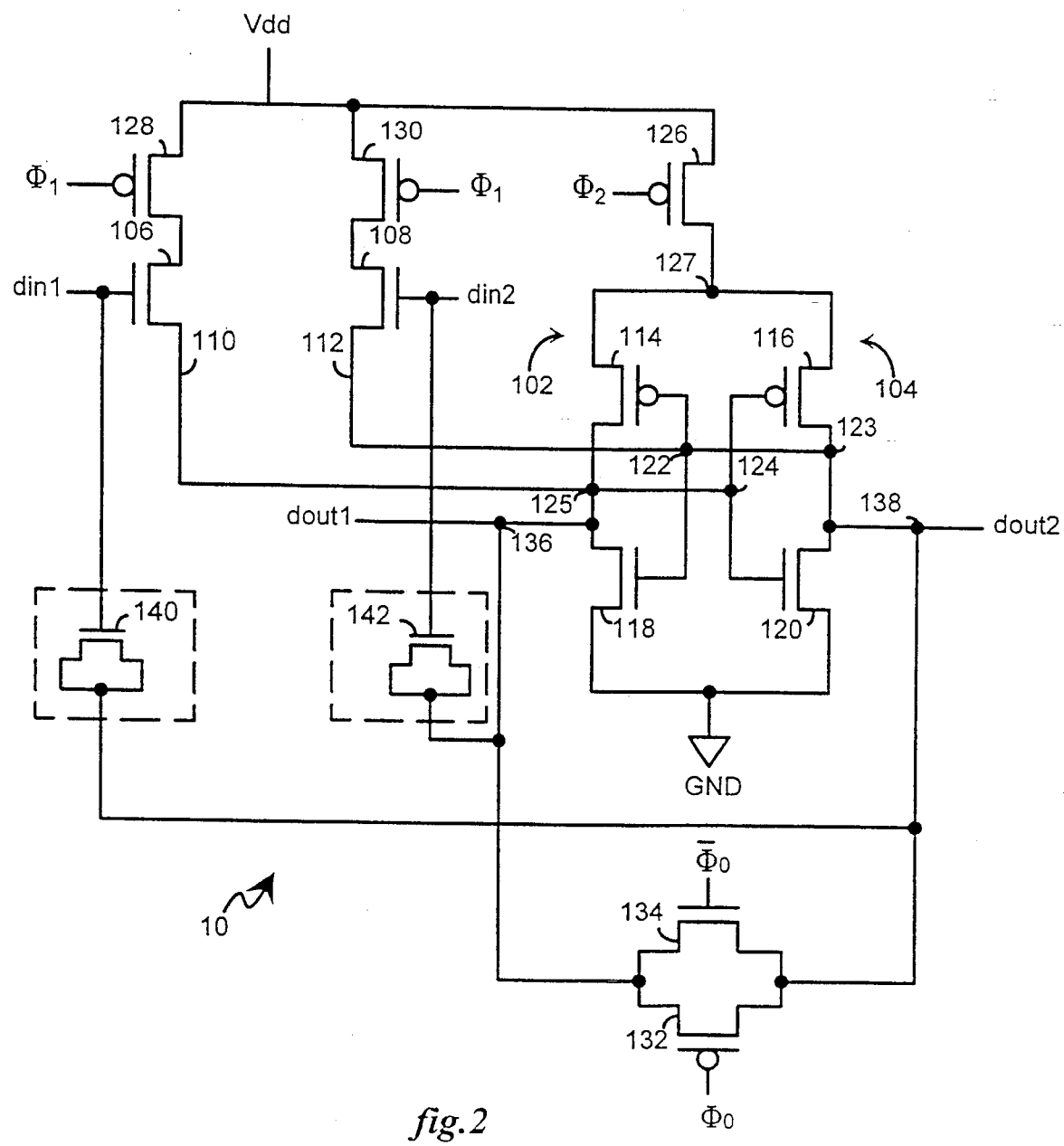
FIG. 2 illustrates, as an example, a sense amplifier circuit utilizing aspects of the present invention.

FIG. 2 illustrates a sense amplifier circuit 10 receiving first and second data inputs, din1 and din2, and generating, in response to control signals, $\Phi 0$ and $\Phi 1$, first and second latched data outputs, dout1 and dout2, having complementary logic states determined by a differential voltage between the first and second data inputs, din1 and din2, and voltage levels determined by high and low reference voltages, Vdd and GND. Typically, the first and second data inputs, din1 and din2, are respectively received via first and second data lines (e.g., 6-1 and 6-2 in FIG. 1) from an analog circuit such as a memory cell (e.g., 5 in FIG. 1); and the first and second latched data outputs, dout1 and dout2, are typically respectively provided via first and second output data lines (e.g., 7-1 and 7-2 in FIG. 1) to a digital circuit, such as a microprocessor (e.g., 8 in FIG. 1).

A first or "voltage developing" stage, including p-mos FETs 128 and 130 and n-mos FETs 106 and 108, receives the first and second data inputs, din1 and din2, and tries to generate, in response to a first control signal $\Phi_1$ being active LOW, a differential voltage across first and second outputs, 110 and 112, which is indicative of a voltage difference between the first and second data inputs, din1 and din2. The p-mos FET 128 has a gate connected to the first control signal $\Phi_1$, a source connected to the high reference voltage Vdd, and a drain connected to the drain of the n-mos FET 106. Similarly, the p-mos FET 130 has a gate also connected to the first control signal $\Phi_1$, a source also connected to the high reference voltage Vdd, and a drain connected to the drain of the n-mos FET 108. The n-mos FET 106 has a gate connected to the first data input din1, a drain connected to the drain of p-mos FET 128, and a source providing the first output 110. The n-mos FET 108 has a gate connected to the second data input din2, a drain connected to the drain of p-mos FET 130, and a source providing the second output 112.

While the first control signal $\Phi_1$ is inactive HIGH, the p-mos FETs 128 and 130 are turned off, and no dc current flows through the first stage. When the first control signal $\Phi_1$ becomes active LOW, however, both p-mos FETs 128 and 130 turn on, respectively connecting the high reference voltage Vdd to the drains of the n-mos FETs 106 and 108. Thereupon, with the n-mos FETs 106 and 108 turning on, the voltage at the source of the n-mos FET 106 (i.e., at the first output 110) tries to become equal to the voltage at the gate of the n-mos FET 106 less the threshold voltage of the n-mos FET 106, and the voltage at the source of the n-mos FET 108 (i.e., at the second output 112) tries to become equal to the voltage at the gate of the n-mos FET 108 less the threshold voltage of the n-mos FET 108. Since the threshold voltages of the n-mos FETs 106 and 108 are preferably equal (i.e., the transistors are matched), the first stage tries to generate a voltage difference across the first and second outputs, 110 and 112, which is substantially equal to the voltage difference between the first and second data inputs, din1 and din2.

A second or "full-swing locking" stage, includes a p-mos FET 126, and a latching circuit comprising first and second cross-coupled inverters, 102 and 104. The p-mos FET 126 connects, in response to a second control signal $\Phi_2$ being active LOW, the high voltage reference Vdd to a power input 127 of the latching circuit. In particular, the source of p-mos FET 126 is connected to the high voltage reference Vdd, the gate of p-mos FET 126 is connected to the second control signal $\Phi_2$, and the drain of p-mos FET 126 is connected to the power input 127 of the latching circuit. Although a complementary n-mos FET might also be included in the second stage to connect, in response to the second control signal $\Phi_2$ being active LOW, the low voltage reference GND to the latching circuit, it is preferable not to include such a complementary n-mos FET. One reason that it is preferable not to include such a complementary n-mos FET is that its elimination allows a differential voltage indicative of a voltage difference between the first and second data inputs, din1 and din2, to develop faster on the first and second data outputs, dout1 and dout2, during a period where the first control signal $\Phi_1$ is active LOW and the second control signal $\Phi_2$ is inactive HIGH.

The latching circuit, including p-mos FETs 114 and 116 and n-mos FETs 118 and 120, generates and latches, in response to voltages initially provided by the first stage at its outputs, 110 and 112, the first and second latched data outputs, dout1 and dout2. The latching circuit is preferably formed of first and second cross-coupled inverters, wherein an output 125 of the first inverter 102 is connected to an input 124 of the second inverter 104, and an output 123 of the second inverter 104 is connected to an input 122 of the first inverter 102. The first inverter 102 comprises a p-mos FET 114 and a n-mos FET 118, wherein the source of the p-mos FET 114 is connected to the power input node 127, the source of the n-mos FET 118 is connected to the low reference voltage GND, the gates of the p-mos FET 114 and the n-mos FET 118 are connected together to form the input 122 of the first inverter 102, and the drains of the p-mos FET 114 and the n-mos FET 118 are connected together to form the output 125 of the first inverter 102. Connected to the input 122 of the first inverter 102 is the second output 112 of the first stage. The second inverter 104 comprises a p-mos FET 116 and a n-mos FET 120, wherein the source of the p-mos FET 116 is connected to the power input node 127, the source of the n-mos FET 120 is connected to the low reference voltage GND, the gates of the p-mos FET 116 and the n-mos FET 120 are connected together to form the input 124 of the second inverter 104, and the drains of the p-mos FET 116 and the n-mos FET 120 are connected together to form the output 123 of the second inverter 104. Connected to the input 124 of the second inverter 104 is the first output 110 of the first stage.

A third or "voltage equalizing" stage, including a p-mos FET 132 and a n-mos FET 134, equalizes, in response to a third control signal $\Phi_0$ being active LOW, voltages on data lines (not shown) respectively connected at nodes 136 and 138 to the first and second data outputs, dout1 and dout2. In particular, the p-mos FET 132 and the n-mos FET 134 form a transmission gate which shorts (i.e., connects) nodes 136 and 138 together when the third control signal $\Phi_0$ is active LOW, and isolates (i.e., disconnects) nodes 136 and 138 from each other when the third control signal $\Phi_0$ is inactive HIGH.

Optionally, a first capacitor 140 may be connected between the first data input, din1, and the second data output, dout2, and a second capacitor 142 may be connected between the second data input, din2, and the first data output, dout1, to avoid clock feedthrough noise to the data lines by respectively providing charge compensation for n-mos FETs 110 and 112. As depicted in FIG. 2, the first capacitor 140, when included in the sense amplifier circuit 10, is preferably a n-mos FET having its gate electrode functions as one electrode of the first capacitor 140, and its connected together drain and source electrodes functions as the other electrode of the first capacitor 140. Similarly, the second capacitor 142, when included in the sense amplifier circuit 10, is preferably a n-mos FET having its gate electrode function as one electrode of the second capacitor 142, and its connected together drain and source electrodes function as the other electrode of the second capacitor 142. The first and second capacitors, 140 and 142, are shown in a dotted box in FIG. 2, to emphasize that their inclusion in the sense amplifier circuit 10 is optional. For example, if the sense amplifier circuit 10 receives as first and second inputs, a pair of bit lines connected to a memory cell, typically, such bit lines are connected to an equalizing circuit which eliminates the need for such first and second capacitors, 140 and 142, providing charge compensation.

To minimize power consumption in the sense amplifier circuit 10, timing of the first, second, and third control signals, $\Phi_1$, $\Phi_2$, and $\Phi_0$, are such that the first control signal $\Phi_1$ is preferably deactivated after the voltage developing stage is no longer needed (e.g., shortly after the second control signal $\Phi_2$ activates the full-swing locking stage), and the third control signal $\Phi_0$ is preferably deactivated when the voltage equalization stage is not needed (e.g., when either the voltage developing or full-swing locking stages are in operation). Although it is preferable to deactivate the first and second control signals, $\Phi_1$ and $\Phi_2$, when activating the third control signal $\Phi_0$ to equalize the voltages on the first and second output data lines (not shown), in applications where additional power consumption can be sacrificed for enhanced performance, it may be preferable to keep the second control signal $\Phi_2$ active when activating the third control signal $\Phi_0$ to equalize the voltages on the first and second output data lines (not shown).

Figure 3:
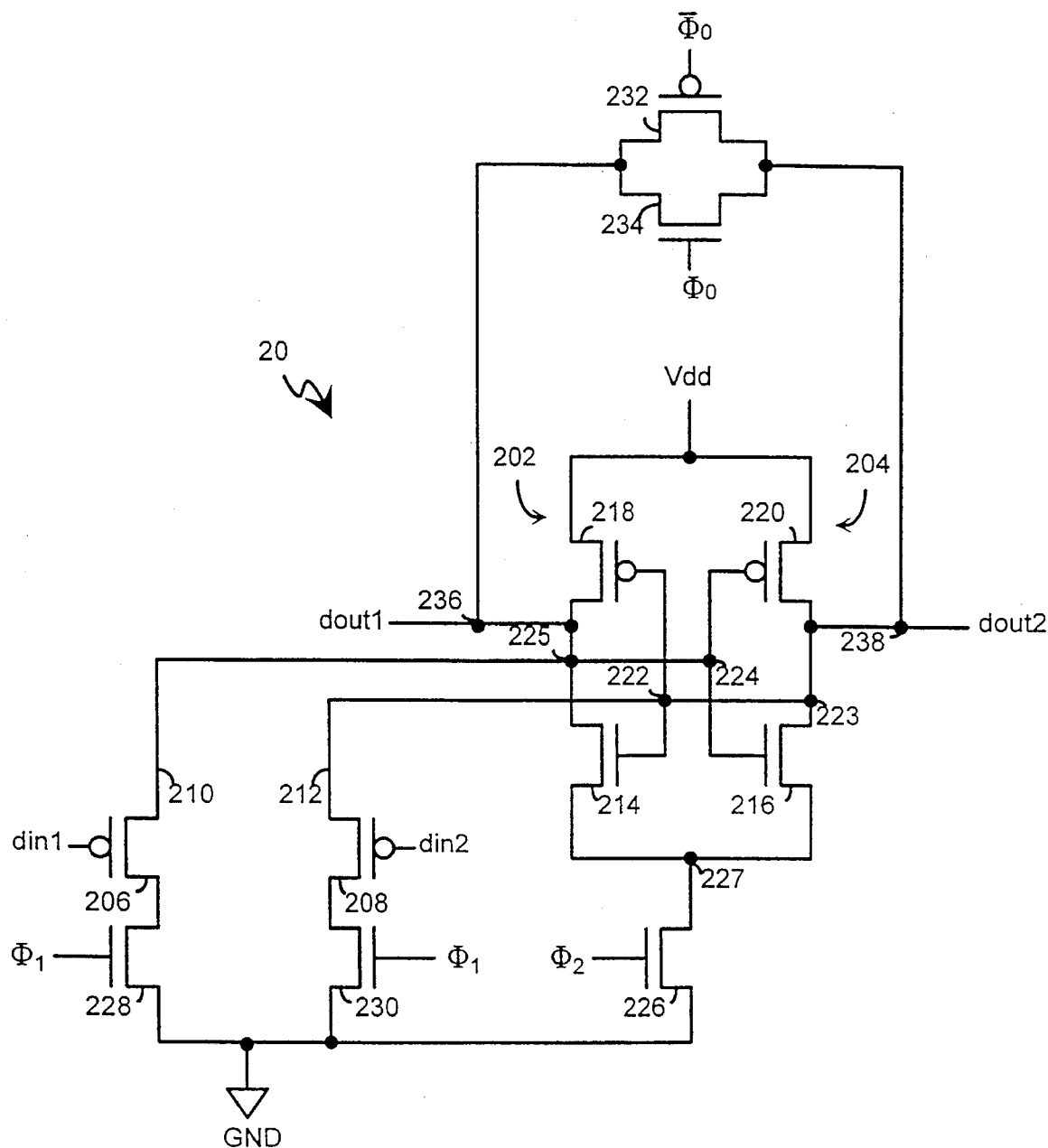
FIG. 3 illustrates, as an example, an alternative sense amplifier circuit utilizing aspects of the present invention.

FIG. 3 illustrates, as an example, an alternative sense amplifier circuit 20, utilizing aspects of the present invention, which functions in a similar manner to the sense amplifier circuit 10. In the sense amplifier circuit 20, a first or "voltage developing" stage, including n-mos FETs 228 and 230 and p-mos FETs 206 and 208, receives the first and second data inputs, din1 and din2, and tries to generate, in response to a first control signal $\Phi_1$ being active HIGH, a differential voltage across first and second outputs, 210 and 212, which is indicative of a voltage difference between the first and second data inputs, din1 and din2. The n-mos FET 228 has a gate connected to the first control signal $\Phi_1$, a source connected to the low reference voltage GND, and a drain connected to the drain of the p-mos FET 206. Similarly, the n-mos FET 230 has a gate also connected to the first control signal $\Phi_1$, a source also connected to the low reference voltage GND, and a drain connected to the drain of the p-mos FET 208. The p-mos FET 206 has a gate connected to the first data input din1, a drain connected to the drain of n-mos FET 228, and a source providing the first output 210. The p-mos FET 208 has a gate connected to the second data input din2, a drain connected to the drain of the n-mos FET 230, and a source providing the second output 212.

While the first control signal $\Phi_1$ is inactive LOW, the n-mos FETs 228 and 230 are turned off, and no dc current flows through the first stage. When the first control signal $\Phi_1$ becomes active HIGH, however, both n-mos FETs 228 and 230 turn on, respectively connecting the low reference voltage GND to the drains of the p-mos FETs 206 and 208. Thereupon, with the p-mos FETs 206 and 208 turning on, the voltage at the source of the p-mos FET 206 (i.e., at the first output 210) tries to become equal to the voltage at the gate of the p-mos FET 206 less the threshold voltage of the p-mos FET 206, and the voltage at the source of the p-mos FET 208 (i.e., at the second output 112) tries to become equal to the voltage at the gate of the p-mos FET 208 less the threshold voltage of the p-mos FET 208. Since the threshold voltages of the p-mos FETs 206 and 208 are preferably equal (i.e., the transistors are matched), the first stage tries to generate a voltage difference generated by the first stage across the first and second outputs, 210 and 212, which is substantially equal to the voltage difference between the first and second data inputs, din1 and din2.

A second or "full-swing locking" stage, includes a n-mos FET 226, and a latching circuit comprising first and second cross-coupled inverters, 202 and 204. The n-mos FET 226 connects, in response to a second control signal $\Phi_2$ being active HIGH, the low voltage reference GND to a ground input 227 of the latching circuit. In particular, the source of n-mos FET 226 is connected to the low voltage reference GND, the gate of n-mos FET 226 is connected to the second control signal $\Phi_2$, and the drain of n-mos FET 226 is connected to the ground input 227 of the latching circuit.

The latching circuit, including n-mos FETs 214 and 216 and p-mos FETs 218 and 220, generates and latches, in response to voltages initially provided by the first stage at its outputs, 210 and 212, the first and second latched data outputs, dout1 and dout2. The latching circuit is preferably formed of first and second cross-coupled inverters, wherein an output 225 of the first inverter 202 is connected to an input 224 of the second inverter 204, and an output 225 of the second inverter 204 is connected to an input 222 of the first inverter 202. The first inverter 202 comprises a n-mos FET 214 and a p-mos FET 218, wherein the source of the n-mos FET 214 is connected to the ground input node 227, the source of the p-mos FET 218 is connected to the high reference voltage Vdd, the gates of the n-mos FET 214 and the p-mos FET 218 are connected together to form the input 222 of the first inverter 202, and the drains of the n-mos FET 214 and the p-mos FET 218 are connected together to form the output 225 of the first inverter 202. Connected to the input 222 of the first inverter 202 is the second output 212 of the first stage. The second inverter 204 comprises a n-mos FET 216 and a p-mos FET 220, wherein the source of the n-mos FET 216 is connected to the ground input node 227, the source of the p-mos FET 220 is connected to the high reference voltage Vdd, the gates of the n-mos FET 216 and the p-mos FET 220 are connected together to form the input 224 of the second inverter 204, and the drains of the n-mos FET 216 and the p-mos FET 220 are connected together to form the output 223 of the second inverter 204. Connected to the input 224 of the second inverter 204 is the first output 210 of the first stage.

A third or "voltage equalizing" stage, including a p-mos FET 232 and a n-mos FET 234, equalizes, in response to a third control signal $\Phi_0$ being active HIGH, voltages on data lines (not shown) respectively connected at nodes 236 and 238 to the first and second data outputs, dout1 and dout2. In particular, the p-mos FET 232 and the n-mos FET 234 form a transmission gate which shorts (i.e., connects) nodes 236 and 238 together when the third control signal $\Phi_0$ is active HIGH, and isolates (i.e., disconnects) nodes 236 and 238 from each other when the third control signal $\Phi_0$ is inactive LOW.

To minimize power consumption in the sense amplifier circuit 20, timing of the first, second, and third control signals, $\Phi_1$, $\Phi_2$, and $\Phi_0$, are such that the first control signal $\Phi_1$ is preferably deactivated after the voltage developing stage is no longer needed (e.g., shortly after the second control signal $\Phi_2$ activates the full-swing locking stage), and the third control signal $\Phi_0$ is preferably deactivated when the voltage equalization stage is not needed (e.g., when either the voltage developing or full-swing locking stages are in operation). Although it is preferable to deactivate the first and second control signals, $\Phi_1$ and $\Phi_2$, when activating the third control signal $\Phi_0$ to equalize the voltages on the first and second output data lines (not shown), in applications where additional power consumption can be sacrificed for enhanced performance, it may be preferable to keep the second control signal $\Phi_2$ active when activating the third control-signal $\Phi_0$ to equalize the voltages on the first and second output data lines (not shown).

Figure 4:
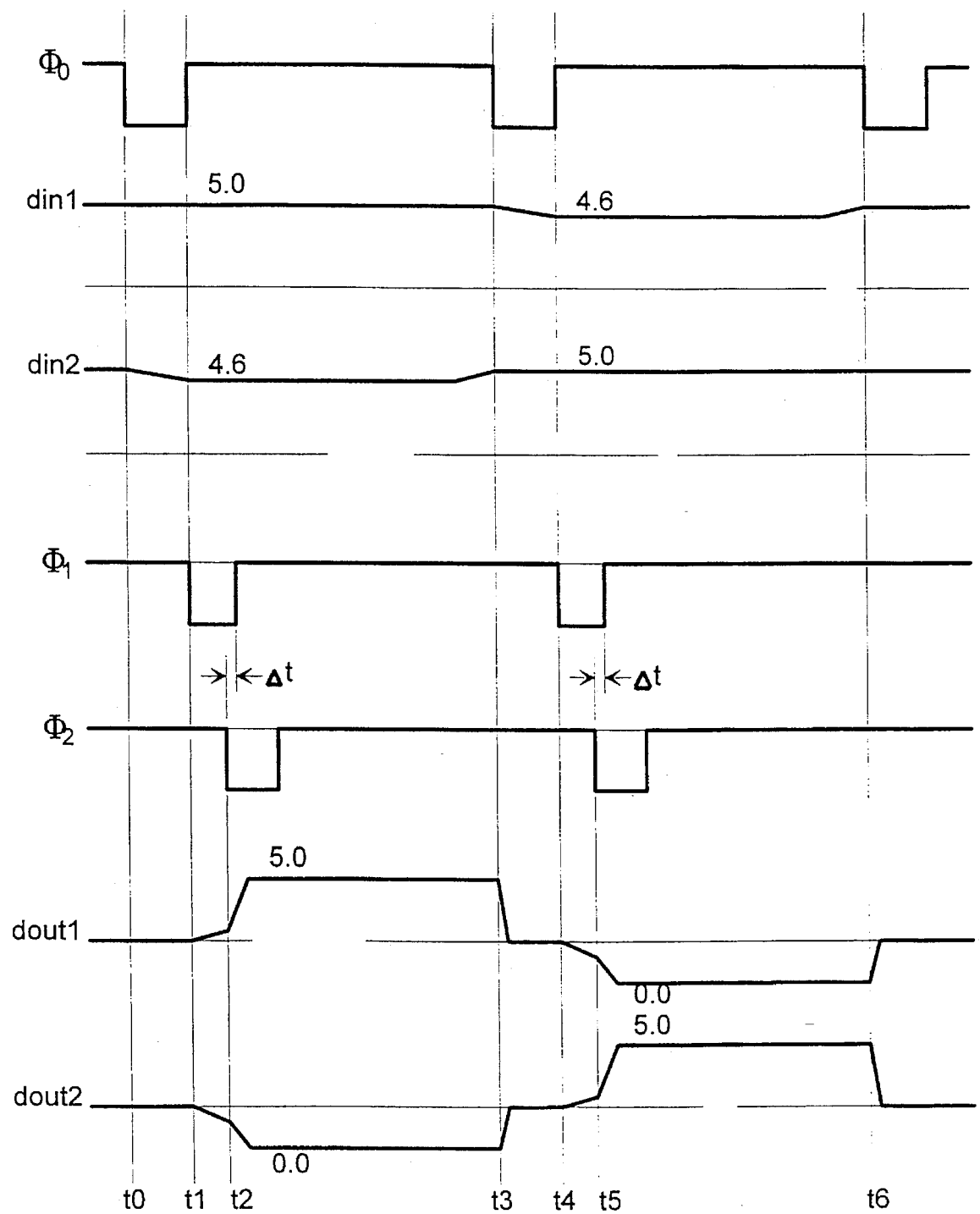
FIG. 4 illustrates, as examples, timing diagrams of certain inputs, outputs, and selected nodes of the sense amplifier circuit of FIG. 2, utilizing aspects of the present invention.

FIG. 4 illustrates timing diagrams useful for describing the operation of the sense amplifier circuit 10. Between time t0 and t1, the sense amplifier circuit 10 operates in a voltage-equalization mode, wherein it equalizes the voltages on the first and second data lines (not shown), which are respectively connected to the first and second data outputs, dout1 and dout2. During this mode, the third control signal $\Phi_0$ is active LOW, and the first and second control signals, $\Phi_1$ and $\Phi_2$, are preferably inactive HIGH. By making the first and second control signals, $\Phi_1$ and $\Phi_2$, inactive HIGH, the p-mos FETs 126, 128, and 130 are turned off, effectively disconnecting the high reference voltage Vdd from the circuit. This minimizes the flow of dc current in the circuit and consequently, minimizes the power consumed by the circuit. If power consumption is not a concern, however, either the first and/or second control signal, $\Phi_1$ and $\Phi_2$, may be kept active LOW when activating the third control signal $\Phi_0$ to equalize the voltages on the first and second data lines (not shown). By making the third control signal $\Phi_0$ active LOW, both the p-mos FET 132 and the n-mos FET 134 turn on, effectively connecting the first and second data lines (not shown) together at nodes 136 and 138. This causes the voltage at node 136 (connected to the first data line) to become equal to the voltage at node 138 (connected to the second data line).

Between time t1 and t2, the sense amplifier circuit 10 operates in a voltage-developing mode, wherein it generates or develops a relatively small differential voltage across the first and second data outputs, dout1 and dout2, which is indicative of a voltage difference between the first and second data inputs, din1 and din2. At or prior to time t1, input voltages are provided on the first and second data inputs, din1 and din2, respectively connected to the gates of n-mos FETs 106 and 108, wherein the difference between the voltages thus provided determines the logic state of the output data to be latched by the sense amplifier circuit 10. Although the first and second data inputs, din1 and din2, preferably reach their respective steady state sensing values prior to time t1, as depicted for example in FIG. 4, this is not a requirement for the sense amplifier circuit 10 to function properly. The sense amplifier circuit 10 will still function properly as long as a significant differential voltage, such as 0.2 volts, develops across the first and second data inputs, din1 and din2, by time t1. Thence, at time t1, the third control signal $\Phi_0$ goes inactive HIGH, turning off the p-mos FET 132 and the n-mos FET 134, so that the voltages at nodes 136 and 138 are no longer forced to being equal. Also at time t1, the first control signal $\Phi_1$ preferably goes active LOW, turning on p-mos FETs 128 and 130, so that a voltage equal to the voltage provided on the first data input din1 less the threshold voltage of the n-mos FET 106 tries to develop at the source of the n-mos FET 106 (i.e., at the first output 110 of the first stage), and a voltage equal to the voltage provided on the second data input din2 less the threshold voltage of the n-mos FET 108 tries to develop at the source of the n-mos FET 108 (i.e., at the second output 112 of the first stage).

Accordingly, by designing the threshold voltages of the n-mos FETs 106 and 108 to be equal, a differential voltage tries to develop across their sources which follows a differential voltage provided across their gates. A contention situation arises, however, and the logic state of the latched data output of the sense amplifier circuit 10 is determined by the higher of the two voltages trying to be developed at the sources of the n-mos FETs 106 and 108. For example, if the threshold voltage of both n-mos FETs 106 and 108 is 1.0 volts, and the voltages provided on the first and second data inputs, din1 and din2, are respectively 5.0 and 4.6 volts (e.g., a differential input voltage of 0.4 volts), then the voltage at the source of the n-mos FET 106 (i.e., at the first output 110 of the first stage) will try to be 4.0 volts and the voltage at the source of the n-mos FET 108 (i.e., at the second output 112 of the first stage) will try to be 3.6 volts (e.g., a differential voltage of 0.4 volts). Although both voltages being applied to the inputs, 122 and 124, of the inverters, 102 and 104, try to drive their respective outputs, 125 and 123, towards a LOW logic state, only the output 123 of the second inverter 104 is driven towards that state, because the voltage trying to be developed (e.g., 4.0 volts) at the input 124 to the second inverter 104 is greater than the voltage trying to be developed (e.g., 3.6 volts) at the input 122 to the first inverter 102. Consequently, the second data output dout2 is driven towards a LOW logic state, and the first data output dout1 is forced towards a HIGH logic state.

As another example indicative of battery powered circuits, if the threshold voltage of both n-mos FETs 106 and 108 is 0.8 volts, and the voltages provided on the first and second data inputs, din1 and din2, are respectively 2.0 and 1.5 volts (e.g., a differential input voltage of 0.5 volts), then the voltage at the source of the n-mos FET 106 (i.e., at the first output 110 of the first stage) will try to be 1.2 volts and the voltage at the source of the n-mos FET 108 (i.e., at the second output 112 of the first stage) will try to be 0.7 volts (e.g., a differential voltage of 0.5 volts). In this case, unlike the previous example, however, the voltage trying to be developed at the input 124 of the inverter 104 tries to drive its output 123, towards a LOW logic state, while the voltage trying to be developed at the input 122 of the inverter 102 is probably inadequate to turn on n-mos FET 118 to drive its output 125 towards a LOW logic state (e.g., if the threshold voltage of n-mos FET 118 is 0.8 volts). Consequently, the second data output dout2 is driven towards a LOW logic state, and the first data output dout1 is forced towards a HIGH logic state.

Since the second control signal $\Phi_2$ is inactive HIGH during the period between time t1 and t2, the high voltage reference Vdd is not connected to the power input node 127 of the inverters, 102 and 104, during that time. Consequently, the power input node 127 is floating, and the data output (dout1 or dout2) being driven to a HIGH logic state, cannot fully reach a voltage level corresponding to that logic state (e.g., the high reference voltage Vdd). The low voltage reference GND, however, is connected to the sources of the n-mos FETs 118 and 120 respectively of the first and second inverters 102 and 104, therefore the data output (dout2 or dout1) being driven to a LOW logic state, may reach the voltage level corresponding to that logic state (e.g., the low reference voltage GND).

Between time t2 and t3, the sense amplifier circuit 10 operates in a full-swing locking mode, wherein it accelerates the rate at which the output (dout1 or dout2) rising to a HIGH logics-state rises, increases the voltage level to which the output (dout1 or dout2) rising to a HIGH logic state rises to, generates the latched data output by latching the output (dout1 or dout2) rising to a HIGH logic state to the HIGH logic state at the increased voltage level and the output (dout2 or dout1) being forced to a LOW logic state to the LOW logic state at a voltage level substantially equal to the low reference voltage GND, and minimizes the dc current flowing through the circuit to minimize the power being consumed by the circuit during the latching mode.

At time t2, the second control signal $\Phi_2$ is activated LOW, causing the p-mos FET 126 to turn on and consequently, the high voltage reference Vdd to be connected to the power input 127 of the first and second inverters, 102 and 104. As a result, the output of the inverter (dout1 or dout2) rising to a HIGH logic state, fully swings to the high reference voltage Vdd, the output of the inverter (dout2 or dout1) falling to a LOW logic state, fully swings to the low reference voltage GND, and the two outputs lock there, since they reenforce each other through the cross-coupled feedback of the two inverters, 102 and 104.

Preferably, the first control signal $\Phi_1$ is inactivated HIGH shortly after time t2, to minimize power consumption. In particular, by so doing, generally no dc current flows through either the first or voltage developing stage of the sense amplifier circuit 10, or the second or full-swing locking stage of the sense amplifier circuit 10. No dc current flows through the first stage, because the p-mos FETs 128 and 130 are turned off. No dc current flows through the second stage after the data outputs, dout1 and dout2, lock to full swing because no dc current flows through the series connected p-mos and n-mos FETs comprising each of the first and second inverters, 102 and 104. For example, if the p-mos FET 114 is turned on, then the n-mos FET 118 is turned off, and no dc current flows through the first inverter 102. Conversely, if the p-mos FET 114 is turned off, then the n-mos FET 118 is turned on, and again, no dc current flows through the first inverter 102. Similarly, if the p-mos FET 116 is turned on, then the n-mos FET 120 is turned off, and no dc current flows through the second inverter 104; and if the p-mos FET 116 is turned off, then the n-mos FET 120 is turned on, and again, no dc current flows through the second inverter 104.

The first control signal $\Phi_1$ is preferably not inactivated HIGH immediately at time t2, however. As shown in FIG. 4, the first control signal $\Phi_1$ is preferably inactivated after a time delay $\Delta t$ following the second control signal $\Phi_2$ being activated LOW, wherein the duration of the time delay $\Delta t$ is selected so as to practically eliminate the latching of spurious noise signals on the inverter inputs, 122 and 124, resulting in erroneous logic level output data being latched by the sense amplifier circuit 10. As an example, a time delay Δt of 0.5 to 1.0 nanoseconds is believed adequate for such purposes using presently available CMOS processes.

During time t3 to t6, the above described operation of the sense amplifier circuit 10 is repeated with the difference that the voltages applied to the first and second data inputs, din1 and din2, to the sense amplifier circuit 10, are reversed. As shown in FIG. 4, by reversing the voltages applied to the first and second data inputs, din1 and din2, the latched data output, dout1 and dout2, reverses. In particular, as depicted in the first cycle represented by the-time period t0 to t3, the first latched data output dout1 is latched to a HIGH logic state (e.g., logic level voltage of 5.0 volts) and the second latched data output dout2 is latched to a LOW logic state (e.g., logic level voltage of 0.0 volts) when voltages of 5.0 and 4.6 volts are respectively applied, for example, to the first and second data inputs, din1 and din2, and as depicted in the second cycle represented by the time period t3 to t6, the first latched data output dout1 is latched to a LOW logic state and the second latched data output dout2 is latched to a HIGH logic state when the reversed voltages of 4.6 and 5.0 volts are respectively applied to the first and second data inputs, din1 and din2.

Figure 5:
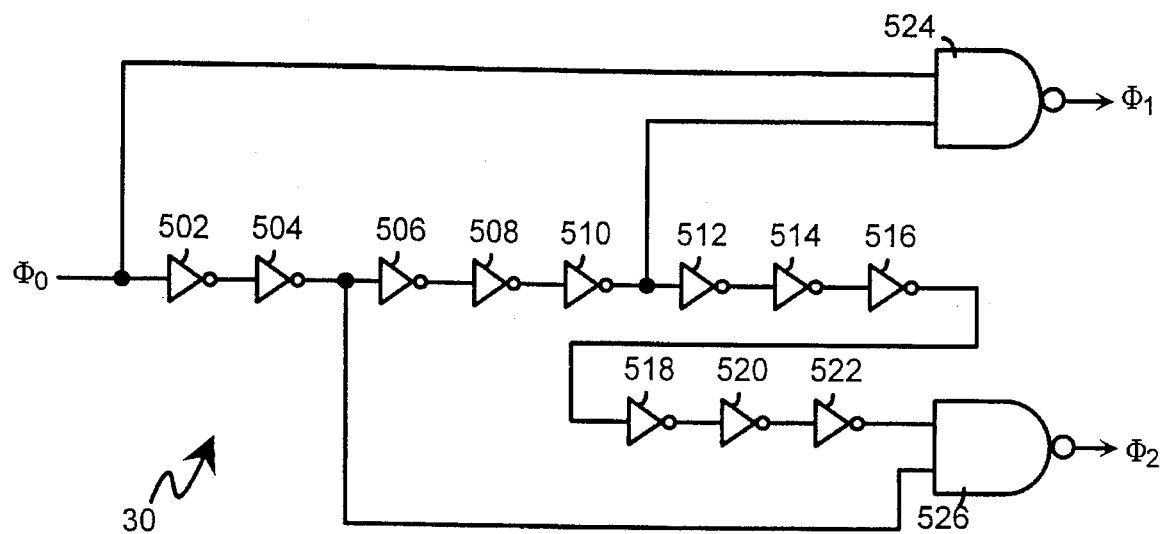
FIG. 5 illustrates, as an example, a logic diagram for a control signal generating unit.

FIG. 5 illustrates, as an example, a logic circuit 30 for generating the first and second control signals, $\Phi_1$ and $\Phi_2$, from the third control signal $\Phi_0$. In this example, the third control signal $\Phi_0$ is connected to a first input of a first NAND gate 524, and an inverted and delayed version of the third control signal $\Phi_0$ is connected to a second input of the first NAND gate 524 to generate the first control signal $\Phi_1$, wherein the inverted and delayed version of the third control signal $\Phi_0$ is generated through an odd number of series connected inverters, 502–510, having a total propagation delay equal to the desired time delay between initiation of the third control signal $\Phi_0$ and the first control signal $\Phi_1$. Similarly, a delayed version of the third control signal $\Phi_0$ is connected to a first input of a second NAND gate 526, and an inverted and delayed version of the third control signal $\Phi_0$ is connected to a second input of the second NAND gate 526 to generate the second control signal $\Phi_2$, wherein the delayed version of the third control signal $\Phi_0$ is generated through an even number of series connected inverted, 502–504, and the inverted and delayed version of the third control signal $\Phi_0$ is generated through an odd number of series connected inverters, 502–522, having a total propagation delay equal to the desired time delay between initiation of the third control signal $\Phi_0$ and the second control signal $\Phi_2$.

Figure 6:
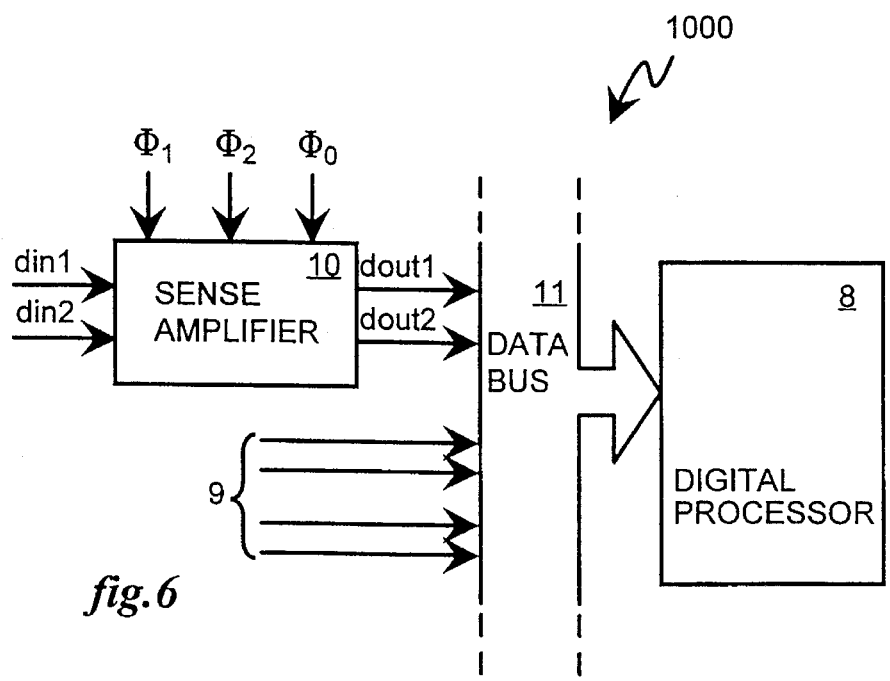
FIG. 6 illustrates, as an example, a block diagram of a microprocessor system including the sense amplifier circuit of either FIG. 2 or FIG. 3, utilizing aspects of the present invention.

FIG. 6 illustrates, as an example, a computer system 1000 including the sense amplifier circuit 10 (or alternatively, the sense amplifier circuit 20), a digital processor 8, and a data bus 11. The sense amplifier circuit 10 (or alternatively, the sense amplifier circuit 20) receives first and second data inputs, din1 and din2, and generates first and second latched data outputs, dout1 and dout2, in a manner described in reference to FIGS. 2–4.

As an example, the first and second data inputs, din1 and din2, may be provided by respective first and second bit lines of a bit line pair connected to a memory cell. In this case, the sense amplifier circuit 10 (or alternatively, the sense amplifier circuit 20) preferably provides its latched logic level data outputs, dout1 and dout2, to respective tri-state drivers (not shown) of the data bus 11, which in turn, provide their outputs to the digital processor 8 when enabled by the digital processor 8. The digital signal processor 8, which may be any one of numerous commercially available microprocessors, such as the type manufactured by Intel and Motorola, then processes the latched data outputs, dout1 and dout2, received from the sense amplifier circuit 10 (or alternatively, the sense amplifier circuit 20), along with other data outputs 9 received, for example, from one or more other circuits (not shown) in the computer system 1000.

As another example, the first and second data inputs, din1 and din2, may be provided by respective first and second analog data lines, wherein the first analog data line is connected to a reference voltage and the second analog data line is connected to a voltage which is to be compared against the reference voltage. In this case, the sense amplifier circuit 10 (or alternatively, the sense amplifier circuit 20) functioning as a comparator, may again provide its latched logic level data outputs, dout1 and dout2, to respective tri-state drivers (not shown) of the data bus 11, which in turn, provide their outputs to the digital processor 8 when enabled by the digital processor 8. The digital signal processor 8 then processes the latched data outputs, dout1 and dout2, received from the sense amplifier circuit 10 (or alternatively, the sense amplifier circuit 20), along with other data outputs 9 received, for example, from one or more other circuits (not shown) in the computer system 1000.

Figure 7:
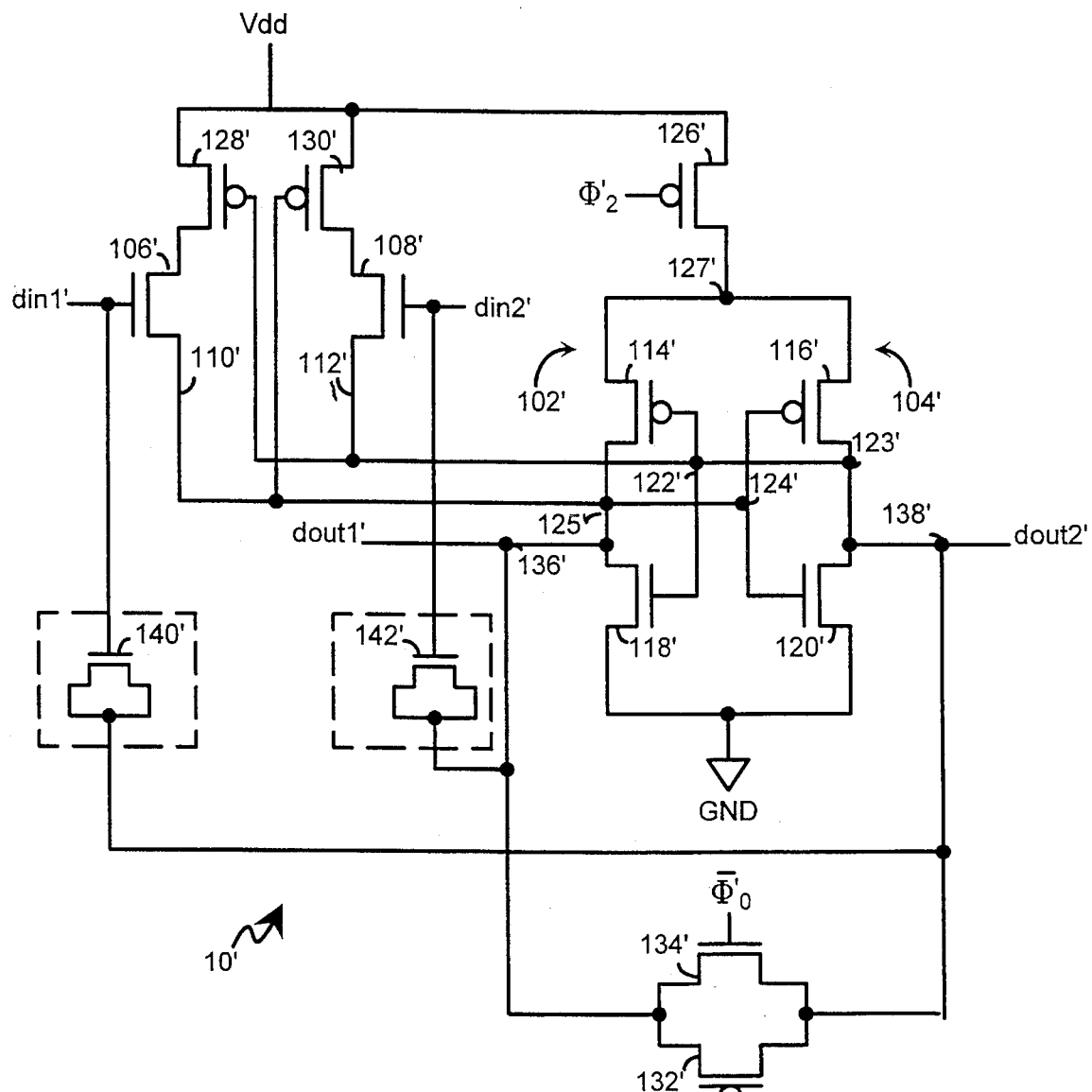
FIG. 7 illustrates, as an example, an alternative embodiment of the sense amplifier circuit illustrated in FIG. 2, utilizing aspects of the present invention.
Figure 8:
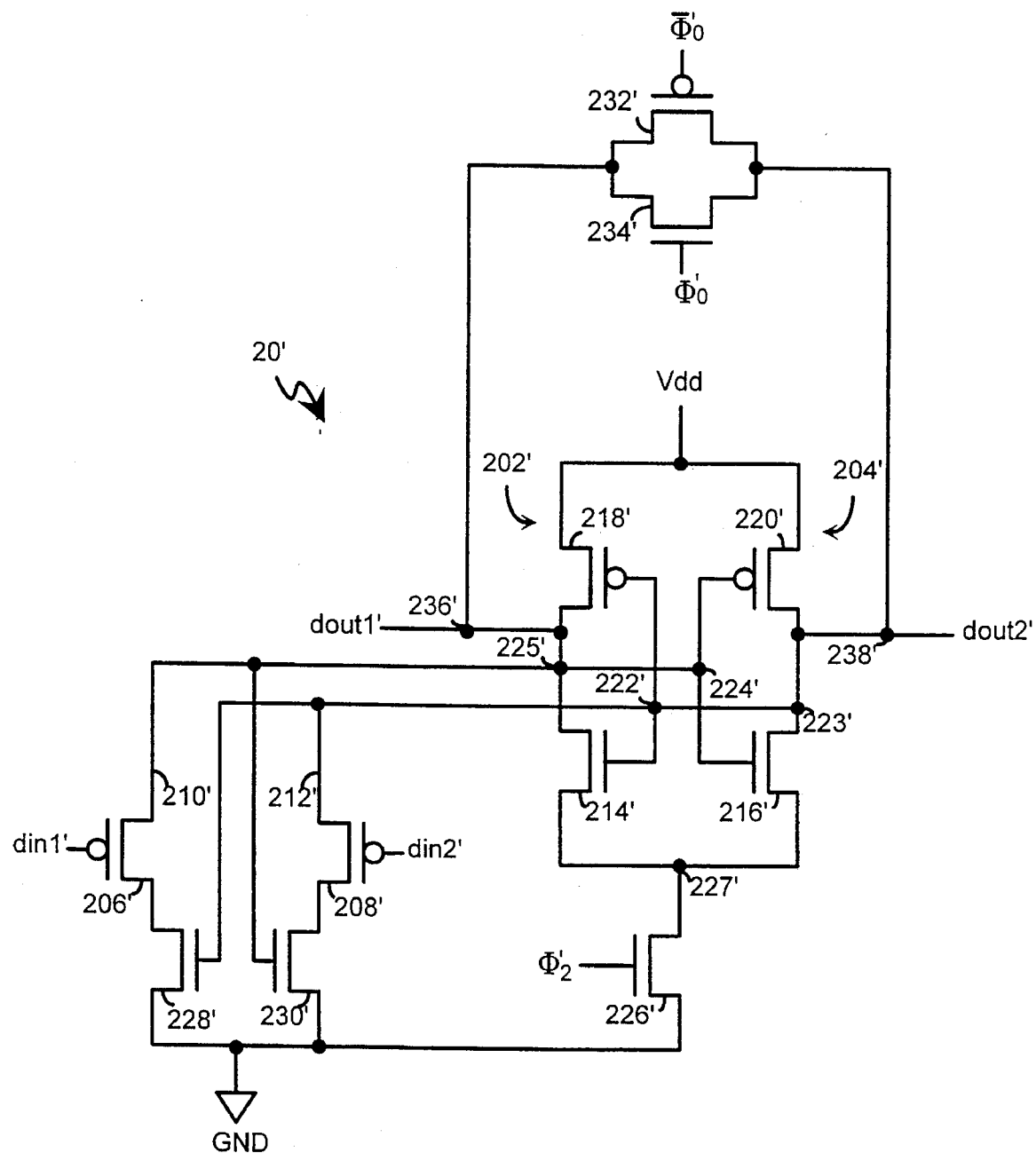
FIG. 8 illustrates, as an example, an alternative embodiment of the sense amplifier circuit illustrated in FIG. 3, utilizing aspects of the present invention.

Thus, FIGS. 2–3 illustrate embodiments of the invention wherein the sense amplifier circuit is controlled by three control signals $\Phi_1$, $\Phi_2$, and $\Phi_0$. On the other hand, FIGS. 7–8 illustrate alternative embodiments of the invention wherein the sense amplifier circuit is controlled by only two control signals $\Phi_0'$ and $\Phi_2'$. The embodiments of FIGS. 7–8 are similar to their corresponding counterparts in FIGS. 2–3 and like elements are so indicated by primed reference numbers. Because of the similarity between in the embodiments in FIGS. 7–8 and their corresponding counterparts in FIGS. 2–3, the structures/elements of the embodiments of FIGS. 7–8 that are similar and function in a similar fashion as those in FIGS. 2–3 will not be described in detail again. Rather, only relevant differences between the embodiments will be described.

Reference is now made to FIG. 7. A significant difference between the sense amplifier circuit 10' of FIG. 7 and its corresponding counterpart, sense amplifier 10 of FIG. 2, is that the sense amplifier circuit 10' only requires two control signals, $\Phi_0'$ and $\Phi_2'$, for operations whereas the sense amplifier circuit 10 requires three control signals, $\Phi_1$, $\Phi_2$, and $\Phi_0$, for operation. In particular, p-mos FETs 128' and 130' of sense amplifier circuit 10' are activated by feedback signals connected to data outputs 123' and 125' respectively, whereas their counterparts, p-mos FETs 128 and 130 of sense amplifier 10 are activated by the control signal $\Phi_1$. Because of such feedback, the sense amplifier 10' eliminates the need for the control signal $\Phi_1$. The rest of sense amplifier circuit 10' is similar to the embodiment illustrated in FIG. 2 and is not discussed any further.

In replacing control signal $\Phi_1$ with feedback signals connected to data outputs 123' and 125', the sense amplifier circuit 10' in FIG. 7 operates differently from its corresponding counterpart, sense amplifier circuit 10 in FIG. 2, in a few aspects. First, because nodes 136 and 138 are connected to feedback signals connected to data outputs, 125' and 123', respectively, in addition to its equalizing function, the "voltage equalizing" stage also serves to activate p-mos FETs 128 and 130 in the embodiment illustrated in FIG. 7. When the control signal $\Phi_0'$ is active LOW, the p-mos FET 132' and the n-mos FET 134' are turned on to connect nodes 136' and 138' together. As a result, the HIGH and LOW voltages at nodes 136' and 138' will equalize at a voltage somewhere between the HIGH and LOW voltages. At-a sufficiently LOW voltage, the equalized voltage activates p-mos FETs 128' and 130'. The activations of p-mos FETs 128' and 130' together with the deactivation of the control signal $\Phi_0'$, being inactive HIGH, trigger the voltage development stage.

Next, during the "full-swing" stage, the latching circuit, including p-mos FETs 114' and 116' and n-mos FETs 118' and 120', generates and latches, in response to voltages provided by the first stage at its outputs, 110' and 112', the first and second complementary latched logic level data outputs, dout1' and dout2'. Because the first and second latched logic level data outputs, dout1' and dout2', are complementary, when dout1' is HIGH, dout2' is LOW. Conversely, when dout1' is LOW, dout2' is HIGH. Moreover, given that latched logic levels, HIGH and LOW, correspond to the high voltage Vdd and the low voltage GND respectively, either p-mos FET 128' or p-mos FET 130', which are both initially active LOW, is automatically deactivated when complementary latched logic levels are achieved at output node 136' and output node 138'. For example, if the first logic level data output dout1' goes HIGH, p-mos FET 130' is shut off thereby accelerating the latching of the first and second complementary latched logic level data outputs dout1' and dout2'. On the other hand, if the second logic level data output dout2' goes HIGH, p-mos FET 128' is shut off thereby accelerating the latching of the first and second complementary latched logic level data outputs dout1' and dout2'.

Finally, during its operation, the sense amplifier circuit 10' requires the second control signal $\Phi_0'$ to be deactivated when the voltage equalization stage is not needed (e.g., when either the voltage developing or full-swing locking stages are in operation). Moreover, because p-mos FETs 128' and 130' are controlled by feedback signals from data outputs dout2' and dout1' respectively and consequently remain active until the latching of the first and second complementary latched logic level data outputs dout1' and dout2', a transient current is continuously provided from the voltage developing circuit to the full-swing latching circuit thereby energizing both inverter 102' and 104' until immediately before the full-swing stage. Since both inverters 102' and 104' are energized prior to the triggering of the full-swing stage, enhanced performance in term of speed occurs as a result. On the other hand, power consumption tends to increase due to the continuous flow of the transient current from the voltage developing circuit. Hence, to minimize unnecessary power consumption, it is preferable to deactivate the first control signal $\Phi_2'$ during both the voltage equalization stage and the voltage developing stage.

Referring now to FIG. 8, A significant difference between sense amplifier circuit 20' of FIG. 8 and its corresponding counterpart, sense amplifier circuit 20 in FIG. 3, is that the sense amplifier circuit 20' requires only two control signals, $\Phi_0'$ and $\Phi_2'$, for operation, whereas the sense amplifier 20 requires three control signals $\Phi_1$, $\Phi_2$, and $\Phi_0$, for operation In particular, n-mos FETs 228' and 230' are activated by feedback signals connected to data outputs 223' and 225' respectively, whereas their counterparts, n-mos FETs 228 and 230 of sense amplifier 20 are activated by the control signal $\Phi_1$. Because of such feedback, the sense amplifier 20' eliminates the need for the control signal $\Phi_1'$. The rest of sense amplifier circuit 20' is similar to the embodiment illustrated in FIG. 3 and is not discussed any further.

In replacing control signal $\Phi_1$ with feedback signals connected to data outputs 223' and 225', sense amplifier circuit 20' operates differently from its corresponding counterpart, sense amplifier circuit 20 in FIG. 3, in a few aspects. First, because nodes 236' and 238' are connected to feedback signals connected to data outputs, 225' and 223', respectively, in addition to its equalizing function, the voltage equalizing stage also serves to activate n-mos FETs 228' and 230' in amplifier circuit 20' illustrated in FIG. 8. When the control signal $\Phi_0'$ is active LOW, the p-mos FET 232' and the n-mos FET 234' are turned on to connect nodes 236' and 238' together. As a result, the HIGH and LOW voltages at nodes 236' and 238' will equalize at a voltage somewhere between the HIGH and LOW voltages. At a sufficiently HIGH voltage, the equalized voltage activates n-mos FETs 228' and 230'. The activations of n-mos FETs 228' and 230' together with the deactivation of the control signal $\Phi_0'$, being inactive HIGH, trigger the voltage development stage.

Next, during the "full-swing" stage, the latching circuit, including n-mos FETs 214' and 216' and p-mos FETs 218' and 220', generates and latches, in response to voltages provided by the first stage at its outputs, 210' and 212', and the first and second complementary latched logic level data outputs, dout1' and dout2'. Because the first and second latched logic level data outputs, dout1' and dout2', are complementary, when dout1' is HIGH, dout2' is LOW. Conversely, when dout1' is LOW, dout2' is HIGH. Moreover, given that latched logic levels, HIGH and LOW, correspond to the high voltage Vdd and the low voltage GND respectively, either n-mos FET 228' or n-mos FET 230', which are both initially active HIGH, is automatically deactivated when complementary latched logic levels are achieved at output node 236' and output node 238'. For example, if the first logic level data output dout1' starts to go LOW, n-mos FET 230' is shut off thereby accelerating the latching of the first and second complementary latched logic level data outputs dout1' and dout2'. On the-other hand, if the second logic level data output dout2' starts to go LOW, n-mos FET 228' is shut off thereby accelerating the latching of the latching of the first and second complementary latched logic level data outputs dout1' and dout2'.

Finally, during its operation, the sense amplifier circuit 20' requires the second control signal $\Phi_0'$ to be deactivated when the voltage equalization stage is not needed (e.g., when either the voltage developing or full-swing locking stages are in operation). Moreover, because n-mos FETs 228' and 230' are controlled by feedback signals from data outputs dout2' and dout1' respectively and consequently remain active until the latching of the first and second complementary latched logic level data outputs dout1' and dout2', a transient current is continuously provided from the voltage developing circuit to the full-swing latching circuit thereby energizing both inverter 202' and 204' until immediately before the full-swing stage. Since both inverters 202' and 204' are energized prior to the triggering of the full-swing stage, enhanced performance in term of speed occurs as a result. On the other hand, power consumption tends to increase due to the continuous flow of the transient current from the voltage developing circuit. Hence, to minimize unnecessary power consumption, it is preferable to deactivate the first control signal $\Phi_2'$ during both the voltage equalization stage and the voltage developing stage.

Figure 9:
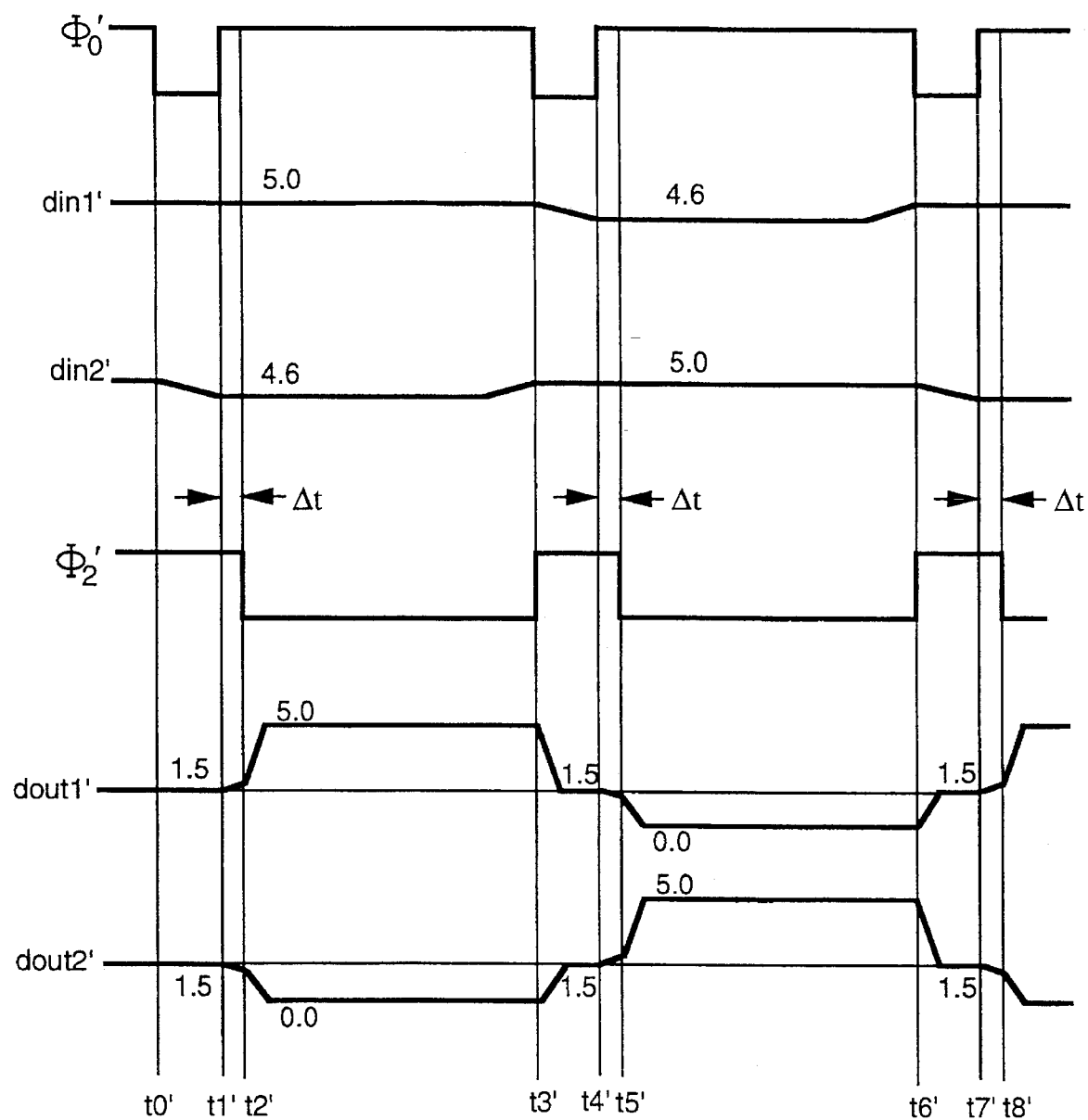
FIG. 9 illustrates, as examples, timing diagrams of certain inputs, outputs, and selected nodes of the sense amplifier circuit of FIG. 7, utilizing aspects of the present invention.

FIG. 9 illustrates timing diagrams useful for describing the operation of the sense amplifier circuit 10' of by FIG. 7. Between time t0' and t1', the sense amplifier circuit 10' operates in a voltage-equalization mode, wherein it equalizes the voltages on the first and second data lines (not shown), which are respectively connected to the first and second data outputs, dout1' and dout2'. During this mode, the second control signal $\Phi_0'$ is active LOW, and the first control signal, $\Phi_2'$, is preferably inactive HIGH. By making the first control signal, $\Phi_2'$, inactive HIGH, the p-mos FET 126' is turned off, effectively disconnecting the high reference voltage Vdd from the latching circuit. This minimizes the flow of the transient current in the sense amplifier circuit and consequently, minimizes the power consumed by the circuit. By making the second control signal $\Phi_0'$ active LOW, both the p-mos FET 132' and the n-mos FET 134' turn on, effectively connecting the first and second data lines (not shown) together at nodes 136' and 138'. This causes the voltage at node 136' (connected to the first data line) to become equal to the voltage at node 138' (connected to the second data line). During this equalization stage, the voltages on the first and second output data lines should be at an adequate level to ensure that both p-mos FETs 128' and 130' are turned on.

Between time t1' and t2', the sense amplifier circuit 10 operates in a voltage-developing mode, wherein it generates or develops a differential voltage across the first and second data outputs, dout1' and dout2', which is indicative of a voltage difference between the first and second data inputs, din1' and din2'. At or prior to time t1', input voltages are provided on the first and second data inputs, din1' and din2', respectively connected to the gates of n-mos FETs 106' and 108', wherein the difference between the voltages thus provided determines the logic state of the output data to be latched by the sense amplifier circuit 10'. Although the first and second data inputs, din1' and din2', preferably reach their respective steady state sensing values prior to time t1', as depicted for example in FIG. 9, this is not a requirement for the sense amplifier circuit 10' to function properly. The sense amplifier circuit 10 will still function properly as long as a significant differential voltage, such as 0.2 volts, develops across the first and second data inputs, din1' and din2', preferably by time t1' but definitely before time t2'. At time t1', the second control signal $\Phi_0'$ goes inactive HIGH, turning off the p-mos FET 132' and the n-mos FET 134', so that the voltages at nodes 136' and 138' are no longer forced to being equal.

Immediately following time t1', however, p-mos FETs 128' and 130' are turned on by feedback signals respectively from the first and second outputs, 110' and 112', which are respectively connected to nodes 136' and 138' and which have been equalized at a sufficient voltage. When the voltages at nodes 136' and 138' are no longer forced to being equal after time t1', a voltage equal to the voltage provided on the first data input din1' less the threshold voltage of the n-mos FET 106' begins to develop at the source of the n-mos FET 106' (i.e., at the first output 110' of the first stage). Similarly, a voltage equal to the voltage provided on the second data input din2 less the threshold voltage of the n-mos FET 108' begins to develop at the source of the n-mos FET 108' (i.e., at the second output 112' of the first stage).

At this time, the p-mos FETs 114' and 116' of inverters 102' and 104', respectively, are not turned on because the control signal $\Phi_2'$ has not been activated. Conversely, the n-mos FETs 118' and 120' of inverters 102' and 104' have been turned on because the sources of n-mos FETs 118' and 120' are connected directly to GND. The n-mos FETs 118' and 120' provide positive feedback to each other because the drain of n-mos FET 118' is connected to the gate of n-mos FET 120' and the drain of n-mos FET 120' is connected to the gate of n-mos FET 118'. As a result, the n-mos FETs 118' and 120' act as a cross-coupled pair and the voltage level of the data output of the sense amplifier circuit 10' is determined by the higher of the two voltages being applied at the sources of n-mos FETs 106' and 108'. In other words, while both voltages being applied to the inputs, 122' and 124', of the n-mos FETs 118' and 120', respectively, try to drive their respective outputs, 125' and 123', towards GND, only the greater voltage between the two succeeds in so doing.

Consequently, one output will be driven toward GND, the other output will be driven toward the voltage being applied at its respective input.

Assuming the threshold voltages of the n-mos FETs 106' and 108' are equal, a differential voltage tries to develop across their sources which follows a differential voltage provided across their gates. A contention situation arises, however, and the logic state of the latched data output of the sense amplifier circuit 10' is determined by the higher of the two voltages trying to be developed at the sources of the n-mos FETs 106' and 108' in the same fashion discussed earlier. For example, if the threshold voltage of both n-mos FETs 106' and 108' is 1.0 volts, and the voltages provided on the first and second data inputs, din1' and din2', are respectively 5.0 and 4.6 volts (e.g., a differential input voltage of 0.4 volts), then the voltage at the source of the n-mos FET 106' (i.e., at the first output 110' of the first stage) will try to be 4.0 volts and the voltage at the source of the n-mos FET 108' (i.e., at the second output 112' of the first stage) will try to be 3.6 volts (e.g., a differential voltage of 0.4 volts). Although both voltages being applied to the inputs, 122' and 124', of the n-mos FETs, 118' and 120', try to drive their respective outputs, 125' and 123', towards a LOW logic state, only the output 123' of the n-mos FET 120' is driven towards that state, because the voltage trying to be developed (e.g., 4.0 volts) at the input 124' to the n-mos FET 120' is greater than the voltage trying to be developed (e.g., 3.6 volts) at the input 122' to the n-mos FET 118'. Consequently, the second data output dout2' is driven towards a LOW logic state, and the first data output dout1' is forced towards a HIGH logic state.

As another example indicative of battery powered circuits, assuming Vdd is 2.0 volts, the threshold voltage of both n-mos FETs 106' and 108' is 0.8 volts, and the voltages provided on the first and second data inputs, din1' and din2', are respectively 2.0 and 1.5 volts (e.g., a differential input voltage of 0.5 volts), then the voltage at the source of the n-mos FET 106' (i.e., at the first output 110' of the first stage) will try to be 1.2 volts and the voltage at the source of the n-mos FET 108' (i.e., at the second output 112 of the first stage) will try to be 0.7 volts (e.g., a differential voltage of 0.5 volts). In this case, unlike the previous example, however, the voltage trying to be developed at the input 24' of the n-mos FET 120' tries to drive its output 123', towards a LOW logic state, while the voltage trying to be developed at the input 122' of n-mos FET 118' is inadequate to turn on n-mos FET 118' to drive its output 125' towards a LOW logic state (e.g., if the threshold voltage of n-mos FET 118' is 0.8 volts). Consequently, the second data output dout2' is driven towards a LOW logic state, and the first data output dout1' is forced towards a HIGH logic state.

Since the first control signal $\Phi_2'$ is inactive HIGH during the period between time t1' and t2', the high voltage reference Vdd is not connected to the power input node 127' of the inverters, 102' and 104', during that time. Consequently, the power input node 127' is floating, and the data output (dout1' or dout2') being driven to a HIGH logic state, cannot fully reach a voltage level corresponding to that logic state (e.g., the high reference voltage Vdd). The low voltage reference GND, however, is connected to the sources of the n-mos FETs 118' and 120' respectively of the first and second inverters 102' and 104', therefore the data output (dout2' or dout1') being driven to a LOW logic state, may reach the voltage level corresponding to that logic state (e.g., the low reference voltage GND).

Between time t2' and t3', the sense amplifier circuit 10' operates in a full-swing locking mode, wherein it accelerates the rate at which the output (dout1' or dout2') rising to a HIGH logic state rises, increases the voltage level to which the output (dout1' or dout2') rising to a HIGH logic state rises to, generates the latched data output by latching the output (dout1' or dout2') rising to a HIGH logic state to the HIGH logic state at the increased voltage level and the output (dout2' or dout1') being forced to a LOW logic state to the LOW logic state at a voltage level substantially equal to the low reference voltage GND, and eliminates the dc current flowing through the circuit to minimize the power being consumed by the circuit during the latching mode.

At time t2', the first control signal $\Phi_2$' is activated LOW, causing the p-mos FET 126' to turn on and consequently, the high voltage reference Vdd to be connected to the power input 127' of the first and second inverters, 102' and 104'. As a result, the output of the inverter (dout1' or dout2') rising to a HIGH logic state, fully swings to the high reference voltage Vdd, the output of the inverter (dout2' or dout1') falling to a LOW logic state, fully swings to the low reference voltage GND, and the two outputs lock there, since they reenforce each other through the cross-coupled feedback of the two inverters, 102' and 104'.

Additionally, one of the feedback signals from first and second outputs, 110' and 112', is inactivated HIGH shortly after time t2'. The reason is first and second outputs, 110' and 112', are connected to output dout1 node 136' and output dout2' node 138' respectively. Accordingly, when dout1' and dout2' fully swing to the HIGH reference voltage Vdd and LOW reference voltage GND, the feedback signal connecting to the output node rising to the HIGH reference voltage Vdd caused its corresponding p-mos FET to be turned off. For example, if the first logic level data output dout1' goes HIGH, p-mos FET 130' is shut off. On the other hand, if the second logic level data output dout2' goes HIGH, p-mos FET 128' is shut off. Consequently, the contention between the voltages being applied to the inputs of the first and second inverters 102' and 104', is eliminated early on which results in the acceleration of the latching of the first and second complementary latched logic level data outputs dout1' and dout2'.

During time t3' to t6', the above described operation of the sense amplifier circuit 10' is repeated with the difference that the voltages applied to the first and second data inputs, din1' and din2', to the sense amplifier circuit 10, are reversed. As shown in FIG. 9, by reversing the voltages applied to the first and second data inputs, din1' and din2', the latched data output, dout1' and dout2', reverses. In particular, as depicted in the first cycle represented by the time period t0' to t3', the first latched data output dout1' is latched to a HIGH logic state (e.g., logic level voltage of 5.0 volts) and the second latched data output dout2' is latched to a LOW logic state (e.g., logic level voltage of 0.0 volts) when voltages of 5.0 and 4.6 volts are respectively applied, for example, to the first and second data inputs, din1' and din2', and as depicted in the second cycle represented by the time period t3' to t6', the first latched data output dout1' is latched to a LOW logic state and the second latched data output dout2' is latched to a HIGH logic state when the reversed voltages of 4.6 and 5.0 volts are respectively applied to the first and second data inputs, din1' and din2'.

Figure 10:
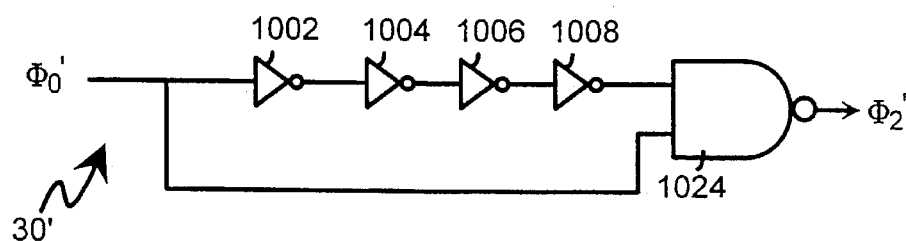
FIG. 10 illustrates, as an example, a logic diagram for a control signal generating unit to be used with the alternative embodiment of the sense amplifier circuit illustrated in FIG. 2.

FIG. 10 illustrates, as an example, a logic circuit 30' for generating the first control signal, $\Phi_2$', from the second control signal $\Phi_0$'. In this example, the second control signal $\Phi_0$' is connected to a first input of a first NAND gate 1024, and a delayed version of the second control signal $\Phi_0$' is connected to a second input of the first NAND gate 1024 to generate the first control signal $\Phi_2$'. The delayed version of the second control signal $\Phi_0$' is generated through an even number of series connected inverters, 1002–1008, having a total propagation delay equal to the desired time delay $\Delta t$ between the activation LOW of the first control signal $\Phi_2$' following the deactivation HIGH of the second control signal $\Phi_0$. Referring back to FIG. 9, an example of the time delay $\Delta t$ is that period between time t1' and time t2'.

Figure 11:
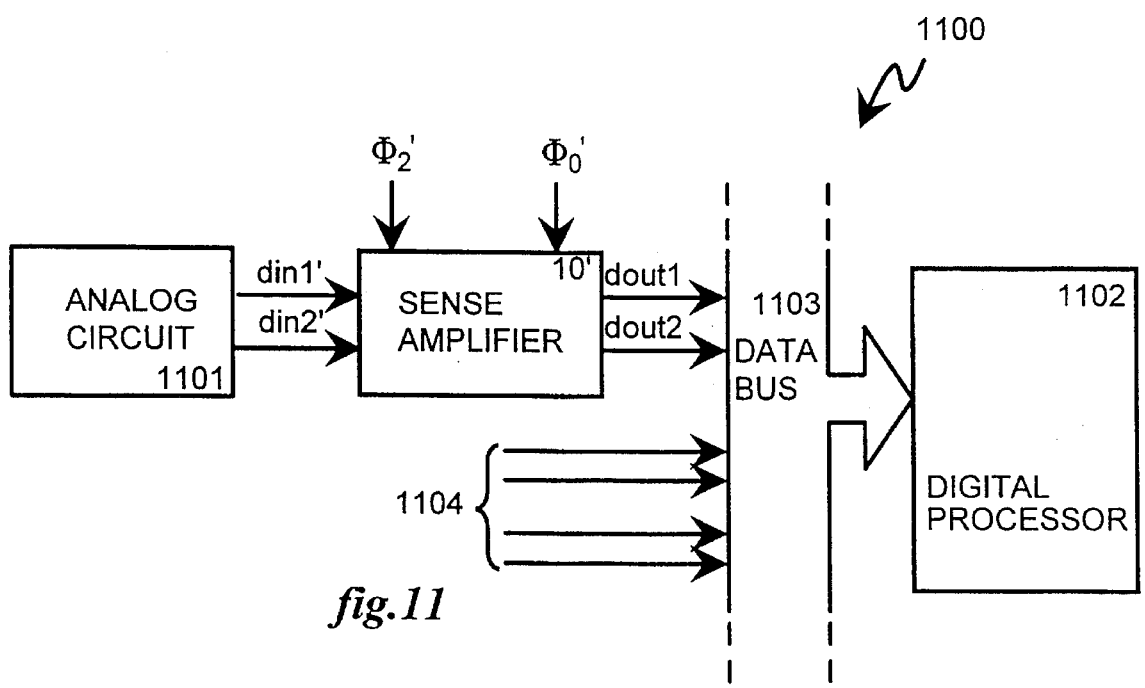
FIG. 11 illustrates, as an example, a block diagram of a microprocessor system including the sense amplifier circuit of either FIG. 7 or FIG. 8, utilizing aspects of the present invention.

FIG. 11 illustrates, as an example, a computer system 1100 including the sense amplifier circuit 10' (or alternatively, the sense amplifier circuit 20'), an analog circuit 1101, a digital processor 1102, and a data bus 1103. The sense amplifier circuit 10' (or alternatively, the sense amplifier circuit 20') receives first and second data inputs, din1' and din2' from the analog circuit 1101 and first and second control signals, $\Phi_0$' and $\Phi_2$', from a control signal generator unit (not shown). The sense amplifier circuit 10' (or alternatively, the sense amplifier circuit 20') then generates in response of these received inputs, first and second latched data outputs, dout1 and dout2, in a similar manner as described in reference to FIGS. 7–9, and provides such first and second latched data outputs, dout1' and dout2' to the digital processor 1102 via the data bus 1103.

As an example, the first and second data inputs, din1' and din2', may be provided by respective first and second bit lines of a bit line pair connected to a memory cell. In this case, the sense amplifier circuit 10' (or alternatively, the sense amplifier circuit 20') preferably provides its latched complementary logic level data outputs, dout1' and dout2', to respective tri-state drivers (not shown) of the data bus 1103, which in turn, provide their outputs to the digital processor 1102 when enabled by the digital processor 1102. The digital signal processor 1102, which may be any one of numerous commercially available microprocessors, such as the type manufactured by Intel and Motorola, then processes the latched complementary logic level data outputs, dout1' and dout2', received from the sense amplifier circuit 10' (or alternatively, the sense amplifier circuit 20'), along with other data outputs 1104 received, for example, from one or more other circuits (not shown) in the computer system 1100.

As another example, the first and second data inputs, din1' and din2', may be provided by respective first and second analog data lines, wherein the first analog data line is connected to a reference voltage and the second analog data line is connected to a voltage which is to be compared against the reference voltage. In this case, the sense amplifier circuit 10' (or alternatively, the sense amplifier circuit 20') functioning as a comparator, may again provide its latched complementary logic level data outputs, dout1' and dout2', to respective tri-state drivers (not shown) of the data bus 1103, which in turn, provide their outputs to the digital processor 1102 when enabled by the digital processor 1102. The digital signal processor 1102 then processes the latched data outputs, dout1' and dout2', received from the sense amplifier circuit 10' (or alternatively, the sense amplifier circuit 20'), along with other data outputs 1104 received, for example, from one or more other circuits (not shown) in the computer system 1100.

Although the various aspects of the present invention have been described with respect to a preferred embodiment, it will be understood that the invention is entitled to full protection within the full scope of the appended claims.

What is claimed is:

1. A sense amplifier circuit for generating first and second complementary latched data outputs indicative of a voltage difference between a first and a second data input, comprising:

a first transistor having a source, a drain, and a gate connected to said first data input, a second transistor having a source, a drain, and a gate connected to said second data input, output generating means connected to said sources of said first and said second transistor for generating a first and a second data output indicative of said first and second data input, first switching means, responsive to said first data output of said output generating means being provided to a control terminal of said first switching means, for providing a first reference voltage to said drain of said first transistor, second switching means, responsive to said second data output of said output generating means being provided to a control terminal of said second switching means, for providing said first reference voltage to said drain of said second transistor, third switching means for providing, in response to a first control signal being provided to a control terminal of said third switching means while said first and second switching means are activated, said first reference voltage to said output generating means such that said first data output of said output generating means is latched to a first voltage level determined by said first reference voltage and said second data output of said output generating means is latched to a second voltage level complementary to said first voltage level thereby generating said first and second complementary latched data outputs indicative of said voltage difference between said first and second data inputs, and equalizing means connected to said first and second data outputs of said output generating means for equalizing voltages respectively on said first and second data outputs in response to a second control signal being provided to at least one terminal of said equalizing means.

2. The sense amplifier circuit as recited in claim 1, wherein said first switching means comprises:

a third transistor having a source connected to said first reference voltage, a drain connected to said drain of said first transistor, and a gate connected to said first data output of said output generating means, said gate being said control terminal of said first switching means.

3. The sense amplifier circuit as recited in claim 1, wherein said second switching means comprises:

a fourth transistor having a source connected to said first reference voltage, a drain connected to said drain of said second transistor, and a gate connected to said second data output of said output generating means, said gate being said control terminal of said second switching means.

4. The sense amplifier circuit as recited in claim 1, wherein said third switching means comprises:

a fifth transistor having a source connected to said first reference voltage, a drain connected to said output generating means, and a gate connected to said first control signal, said gate being said control terminal of said third switching means.

5. The sense amplifier circuit as recited in claim 1, wherein said output generating means comprises:

a first inverter having said first data output of said output generating means as a data output, a data input, and a reference voltage input connected to said third switching means for receiving said first reference voltage from said second switching means, and a second inverter having said second data output of said output generating means as a data output, a data input, and a reference voltage input connected to said reference voltage input of said first inverter and said third switching means for receiving said first reference voltage from said second switching means, wherein said data output of said second inverter is connected to said source of said second transistor and to said data input of said first inverter, said data output of said first inverter is connected to said source of said first transistor and to said data input of said second inverter, and said data output of said first inverter and said data output of said second inverter are provided as activating signals to said second and first switching means respectively.

6. The sense amplifier circuit as recited in claim 5, further comprising:

a first capacitor connected between said gate of said first transistor and said data output of said second inverter, to provide charge compensation for said first transistor, and a second capacitor connected between said gate of said second transistor and said data output of said first inverter, to provide charge compensation for said second transistor.

7. The sense amplifier circuit as recited in claim 5, wherein said first inverter comprises:

a sixth transistor having a source, a drain, and a gate, and a seventh transistor having a source, a drain, and a gate, wherein said source of said sixth transistor acts as said reference voltage input of said first inverter, said gates of said sixth and seventh transistors are connected together to form said data input of said first inverter, and said drains of said sixth and seventh transistors are connected together to form said data output of said first inverter.

8. The sense amplifier circuit as recited in claim 5, wherein said second inverter comprises:

a eighth transistor having a source, a drain, and a gate, and a ninth transistor having a source, a drain, and a gate, wherein said source of said eighth transistor acts as said reference voltage input of said second inverter, said gates of said eighth and ninth transistors are connected together to form said data input of said second inverter, and said drains of said eighth and ninth transistors are connected together to form said data output of said second inverter.

9. The sense amplifier circuit as recited in claim 1, wherein said equalizing means comprises:

a tenth transistor having a source, a drain, and a gate connected to said second control signal, and an eleventh transistor having a source, a drain, and a gate connected to an inverted version of said second control signal, wherein said source of said tenth transistor is connected to said drain of said eleventh transistor and to said first data output, and said drain of said tenth transistor is connected to said source of said eleventh transistor and to said second data output.

10. A method of generating complementary latched data outputs indicative of a voltage difference between a first and a second data line, comprising:

forming a latching circuit comprising first and second inverters each having a data input and a data output, wherein said data output of said first inverter is connected to said data input of said second inverter and said data output of said second inverter is connected to said data input of said first inverter, equalizing, in response to a first control signal being active, voltages respectively on said outputs of said first and second inverters, connecting, in response to a first and second activating signals supplied respectively from said data output of said first inverter and said data output of said second inverter, a first voltage corresponding to said first data line connected to said input of said first inverter and a second voltage corresponding to said second data line connected to said input of said second inverter, connecting, in response to a second control signal being active, a reference voltage corresponding to a logic state to said first and second inverters such that said output of said first inverter is pulled to said reference voltage when said data output of said first inverter is in said logic state and said data output of said second inverter is pulled to a voltage complementary to said reference voltage when said data output of said second inverter is in said logic state, wherein the logic states of said outputs of said first and second inverters are determined by the relative magnitudes of said first and second Voltages respectively connected to said inputs of said first and second inverters, and generating said complementary latched data outputs at said outputs of said first and second inverters.

11. A computer system comprising:

a microprocessor, a data bus connected to said microprocessor, and a sense amplifier circuit connected to said data bus, wherein said sense amplifier circuit generates a first and second complementary latched data outputs indicative of a voltage difference between a first and a second data line, and said sense amplifier circuit includes:

a first transistor having a source, a drain, and a gate connected to said first data input, a second transistor having a source, a drain, and a gate connected to said second data input, output generating means connected to said sources of said first and second transistors for generating a first and a second data output indicative of said first and second data input, first switching means, responsive to said first data output of said output generating means being provided to a control terminal of said first switching means, for providing a first reference voltage to said drain of said first transistor, second switching means, responsive to said second data output of said output generating means being provided to a control terminal of said second switching means, for providing said first reference voltage to said drain of said second transistor, third switching means for providing, in response to a first control signal being provided to a control terminal of said third switching means while said first and second switching means are activated, said first reference voltage to said output generating means such that said first data output of said output generating means is latched to a first voltage level determined by said first reference voltage and said second data output of said output generating means is latched to a second voltage level complementary to said first voltage level thereby generating said first and second complementary latched data outputs indicative of said voltage difference between said first and second data inputs, and equalizing means connected to said first and second data outputs of said output generating means for equalizing voltages respectively on said first and second data outputs in response to a second control signal being provided to at least one terminal of said equalizing means.

12. The sense amplifier circuit as recited in claim 11, wherein said first switching means comprises:

a third transistor having a source connected to said first reference voltage, a drain connected to said drain of said first transistor, and a gate connected to said first data output of said output generating means, said gate being said control terminal of said first switching means.

13. The sense amplifier circuit as recited in claim 11, wherein said second switching means comprises:

a fourth transistor having a source connected to said first reference voltage, a drain connected to said drain of said second transistor, and a gate connected to said second data output of said output generating means, said gate being said control terminal of said second switching means.

14. The sense amplifier circuit as recited in claim 11, wherein said third switching means comprises:

a fifth transistor having a source connected to said first reference voltage, a drain connected to said output generating means, and a gate connected to said first control signal, said gate being said control terminal of said third switching means.

15. The computer system as recited in claim 11, wherein said output generating means comprises:

a first inverter having said first data output of said output generating means as a data output, a data input, and a reference voltage input connected to said third switching means for receiving said first reference voltage from said second switching means, and a second inverter having said second data output of said output generating means as a data output, a data input, and a reference voltage input connected to said reference voltage input of said first inverter and said third switching means for receiving said first reference voltage from said second switching means, wherein said data output of said second inverter is connected to said source of said second transistor and to said data input of said first inverter, said data output of said first inverter is connected to said source of said first transistor and to said data input of said second inverter, and said data output of said first inverter and said data output of said second inverter are provided as activating signals to said second and first switching means respectively.

16. The computer system as recited in claim 15, further comprising:

a first capacitor connected between said gate of said first transistor and said data output of said second inverter, to provide charge compensation for said first transistor, and a second capacitor connected between said gate of said second transistor and said data output of said first inverter, to provide charge compensation for said second transistor.

17. The computer system as recited in claim 15, wherein said first inverter comprises:

a sixth transistor having a source, a drain, and a gate, and a seventh transistor having a source, a drain, and a gate, wherein said source of said sixth transistor acts as said reference voltage input of said first inverter, said gates of said sixth and seventh transistors are connected together to form said data input of said first inverter, and said drains of said sixth and seventh transistors are connected together to form said data output of said first inverter.

18. The computer system as recited in claim 15, wherein said second inverter comprises:

a eighth transistor having a source, a drain, and a gate, and a ninth transistor having a source, a drain, and a gate, wherein said source of said eighth transistor acts as said reference voltage input of said second inverter, said gates of said eighth and ninth transistors are connected together to form said data input of said second inverter, and said drains of said eighth and ninth transistors are connected together to form said data output of said second inverter.

19. The computer system as recited in claim 11, wherein said equalizing means comprises:

a tenth transistor having a source, a drain, and a gate connected to said second control signal, and an eleventh transistor having a source, a drain, and a gate connected to an inverted version of said second control signal, wherein said source of said tenth transistor is connected to said drain of said eleventh transistor and to said first data output, and said drain of said tenth transistor is connected to said source of said eleventh transistor and to said second data output.

* * * * *